United States Patent [19]

Puumalainen et al.

[11] Patent Number: 4,572,957

[45] Date of Patent: Feb. 25, 1986

[54] MEANS FOR CREATING AN ELECTRON CURTAIN

[75] Inventors: Pertti Puumalainen; Pertti Sikanen, both of Kuopio, Finland

[73] Assignee: Enso-Gutzeit Oy, Helsinki, Finland

[21] Appl. No.: 606,704

[22] Filed: May 3, 1984

[30] Foreign Application Priority Data

May 3, 1983 [FI] Finland ................................ 831532

[51] Int. Cl.[4] ........................ H01J 37/15; H01J 33/00

[52] U.S. Cl. .............................. 250/493.1; 250/492.3; 250/396 R

[58] Field of Search ............... 250/493.1, 492.1, 492.3, 250/398, 400, 423 R, 396 R

[56] References Cited

U.S. PATENT DOCUMENTS 3,144,552 8/1964 Schonberg et al. ............. 250/492.3

*Primary Examiner*—Alfred E. Smith
*Assistant Examiner*—Jack I. Berman
*Attorney, Agent, or Firm*—Toren, McGeady, Stanger, Goldberg & Kiel

[57] ABSTRACT

The invention concerns a device for creating an electron curtain (5). The device consists of a cylindrical chamber (1) in which has been accommodated an elongated, electron-emitting filament (2) and a shell (3) encircling the filament so that the filament is located in an elongated depression (6) formed by the shell. Furthermore, the device comprises members (7) for accelerating the electrons and a window (4) in the wall of the chamber (1), through which the electron curtain can be directed to the outside of the device. The shell (3) encircling the filament (2) has on both margins of the depression (6) been shaped into an accelerating electrode (7) which can be brought to a negative potential with reference to the wall of the chamber (1), and the depression constitutes a diffusion volume for the electrons emitted from the filament and in the region of which there are mouldable parts, such as the accelerating electrodes (7) or the additional electrodes (9) on the bottom of the depression, by the aid of which the admission of electrons into the accelerating electric field and thereby the intensity of the electron curtain (5) that is produced are adjustable. Owing to the diffusion of electrons, it is possible with the means to produce an electron curtain with uniform intensity, and by suitably shaping the parts (7,9), the intensity distribution of the curtain may be adjusted in desired manner.

4 Claims, 5 Drawing Figures

MEANS FOR CREATING AN ELECTRON CURTAIN

Figure 1:
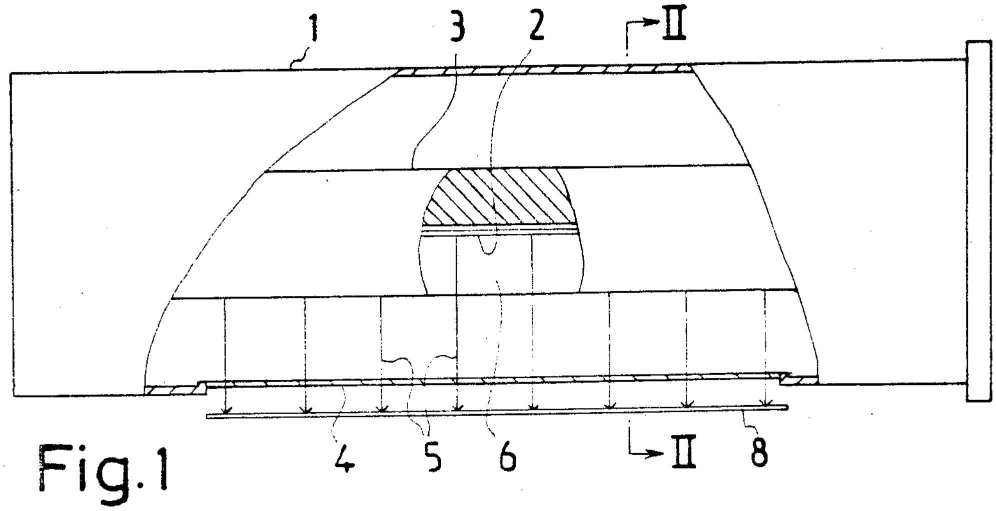

The object of this invention is a means for creating an electron curtain, comprising an elongated, electron-emitting filament, a shell encircling the filament so that the filament is located in an elongated depression formed by the shell, members for accelerating electrons, and a chamber in which the filament with encircling shell has been placed and in the wall of which is provided a window transparent to electrons, through which the electron curtain can be directed.

Material surfaces can be treated, e.g. with the purpose of producing certain chemical reactions, by directing an electron radiation on them. Of such reactions that can be contemplated there may be mentioned cross-linking or polymerizing of a film at room temperature and the curing of surface coatings or laminations, and electron radiation is in addition appropriate for instance in sterilizing packages.

It is known in the art, in irradiating extensive material surfaces, to employ a focussed electron beam. However, in this procedure simultaneous irradiation of different parts of the surface is not possible: the procedure implies that the electron beam sweeps over the surface to be irradiated, and this implies that the apparatus that is required is comparatively complicated.

It is further known to accomplish the irradiation with the aid of a planar electron curtain, in which case the apparatus will be substantially simpler. The electron curtain is produced, using for electron source a lineal incandescent filament placed in a vacuum chamber, the electrons detached therefrom being accelerated with high voltage and directed through a window, transparent to electrons, in the wall of the chamber to the outside of the chamber. However, this procedure has been embarrassed by the difficulty that because the properties of the incandescent filament are somewhat variable at different points along the filament, the result has been an electron curtain with non-uniform intensity dfistribution in the breadth direction of the curtain.

The object of the present invention is to eliminate the drawbacks, mentioned above, associated with designs of prior art and to provide a means by which an electron curtain can be created which has a uniform intensity distribution in the breadth direction of the curtain, or in which the said distribution can be regulated to be as desired. The means of the invention is characterized in that the shell encircling the electron-emitting filament has been shaped on both margins of the depression to be an accelerating electrode which can be placed at a negative potential with reference to the chamber wall, and that the depression constitutes a diffusion volume for the electrons emitted from the filament, and this volume in its region containing portions which can be shaped and by the aid of which the entrance of electrons into the accelerating electric field and as a corollary the intensity of the electron curtain being produced are adjustable.

The operation of the means of the invention is based on the fact that the depression constituted by the shell causes a certain delay to the entrance in the electron-accelerating electric field of the electrons emitted from the filament. During this delay period, diffusion has time to take place in the depression, which tends to equalize the density differentials in the electron cloud in the longitudinal direction of the filament. Moreover, the shell encircling the depression absorbs electrons, thus affording a way to control the number of electrons ending up in the accelerating electric field, and thus the intensity distribution of the electron curtain, with the aid of the configuration of the shell and of the accelarating electrodes belonging thereto. It is possible, for instance, to adjust the distance between the accelerating electrodes, i.e., the width of the gap through which the electrons depart from the depression serving as diffusion volume, and whereby one exerts an influence on the number of electrons enabled to enter the accelerating field, or it is possible to adjust the shape of the accelerating electrodes, whereby it is possible to alter the density of field lines in the accelerating field. It is furthermore possible by adjusting the distance between the accelerating electrodes and the incandescent filament to exert an influence on the delay time of the electrons in the diffusion space.

An advantageous embodiment of the invention is characterized in that the margins of the depression acting as accelerating electrodes consist of an elastic, mouldable material. This design solution affords the possibility to adjust the intensity distribution of the electron curtain created by the means, on the basis of experimentation.

Another advantageous embodiment of the invention is characterized in that on the bottom of the depression there are two projections side by side, the filament being placed between them, so that the projections serve as additional electrodes which regulate the entrance of electrons emitted from the filament into the diffusion space which the depression forms. These additional electrodes may also be of elastic, mouldable material.

The invention may furthermore be applied in the way that the shell encircling the filament comprises movable parts by the aid of which it is possible to alter the shape of the depression and/or the spacing between electrodes and thereby to regulate the admission of electrons into the accelerating electric field. The shell may in that case be connected to the outside of the chamber by a mechanism enabling parts of the shell to be moved while the means is in operation.

The invention is described in the following in greater detail with the aid of examples, with reference to the attached drawing, wherein FIG. 1 presents a means according to the invention for creating an electron curtain, and a film web meant to be irradiated with electrons, as seen from one side of the means and partly sectioned.

Figure 2:
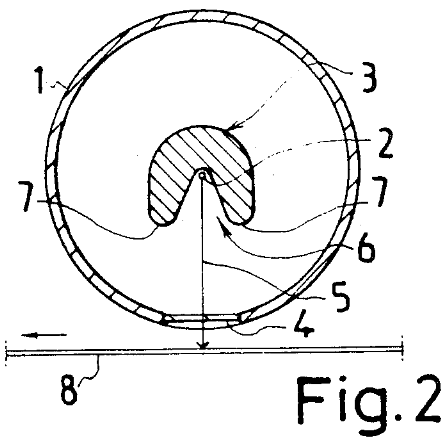

FIG. 2 shows the section II—II of FIG. 1.

Figure 3:
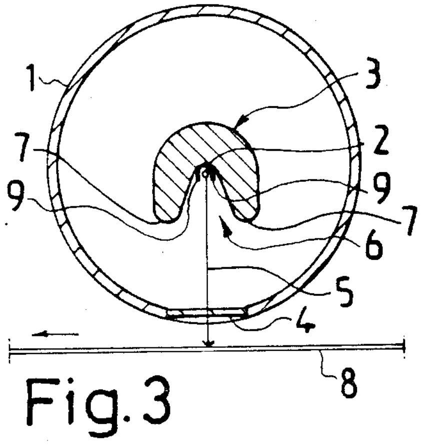

FIG. 3 corresponds to FIG. 2, illustrating a second embodiment of the invention.

Figure 4:
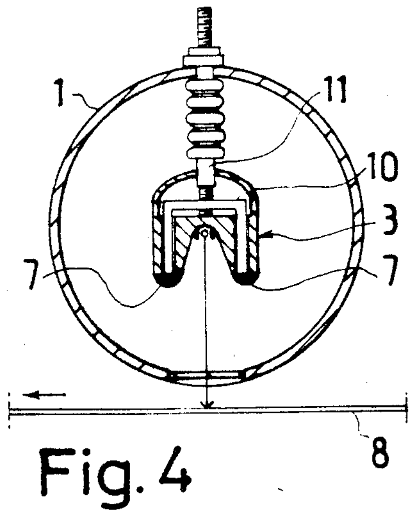
Figure 5:
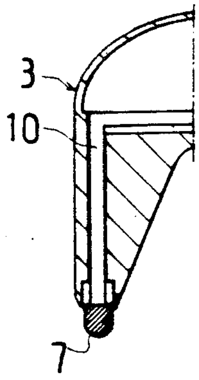

FIG. 4 corresponds to FIG. 2, illustrating a third embodiment of the invention; and FIG. 5 presents part of the shell encircling the electron-emitting filament, which belongs as a component to the means, as taught by a fourth embodiment of the invention.

In FIGS. 1 and 2 has been presented a means according to one embodiment of the invention for creating an electron curtain, this means comprising a cylindrical vacuum chamber 1 of steel, an elongated filament 2 parallelling the axis of the chamber, and an elongated shell 3 of steel encircling the filament. In the wall of the chamber 1 has been provided a window 4, transparent to electrons, parallelling the axis of the chamber, this window consisting of titanium and the electron curtain produced by the means being directable threthrough. In the drawing, arrows 5 represent the electron curtain. The shell 3 encircling the filament 2 has been given such shape that the filament is located in an elongated depression 6 formed by the shell, this depression opening towards the window 4 in the chamber wall. On both margins of the depression 6, the shell 3 has been shaped to constitute an accelerating electrode 7, whereby the electrodes will accelerate the electrons which have been emitted from the filament 2 and have entered the electric field between them, as a curtain towards the window 4 and further through the window so that they strike the film web 8 that is meant to be irradiated and is conducted past the window.

Generation of the electron curtain 5 with the means just described is effected by applying to the accelerating electrodes 7 a negative voltage of a few hundred kV with reference to the wall of the chamber 1. The electrons emitted from the filament 2 will then form an electron cloud in the depression 6 formed by the shell 3. The depression 6 acts as a diffusion volume, protected from the electric field, which equalises the density of the electron cloud in the longitudinal direction of the filament 2. That such diffusion takes place is due to the delay between emission of the electrons and their entrance in the electric field between the accelerating electrodes 7, this delay being dependent, among other things, on the size of the depression 6 and on the distance between the filament 7 and the accelerating electrodes 7. The accelerating electrodes 7 accelerate and focus the electrons that have entered the field, towards the window 4 in the wall of the chamber 1, in the configuration of a curtain 5 with uniform electrode density, this curtain striking the film web 8 to be irradiated, after passing through the window.

In FIG. 3 is shown an embodiment of the invention in which on the bottom of the depression 6 have been provided two mutually parallel projections 9, the filament 2 being placed between them. The projections 9 are of an elastic, mouldable material, such as spring steel, and they serve as additional electrodes which regulate the entrance of the electrons emitted from the filament 2 into the diffusion volume constituted by the depression. This regulation may take place for instance in that the distance between the projections 9 or the location of the filament 2 between the projections is altered.

In FIG. 4 is further presented an embodiment of the invention which as to its principle of operation corresponds to those already presented, but in which it is possible, deviating from them, to adjust the intensity of the electron curtain that is produced, while the means is in operation. This has been achieved by making the accelerating electrodes 7 of an elastic, mouldable material, such as spring steel, and by connecting the electrodes with the space outside the wall of the chamber 1 by the aid of a mechanism by which the electrodes can be moved. The mechanism comprises a piece 10 shaped like an inverted letter U and placed inside the shell 3 and which has been connected by its end to the accelerating electrodes 7, and a threaded vertical shaft 11 which by one end connects with threads to the piece 10 and the other end of which extends to the outside of the wall of the chamber 1. Thus, the piece 10 can be moved in the vertical direction by turning the shaft 11.

In the embodiment of FIG. 4, the intensity regulation of the electron curtain is based on changing the shape of the accelerating electrodes by the aid of a mechanism connected to them. In FIG. 5 is presented a further embodiment of the invention, in which the accelerating electrode 7 moves substantially without changing shape, along with a mechanism 10 connected to it. Moving the accelerating electrode 7 will then change the distance between it and the filament on one hand and the distance between it and the chamber window on the other hand, which both in their turn have an influence on the diffusion time and on the electric field strength, and further on the intensity of the electron curtain that is produced.

Particularly in associated with the embodiments of FIGS. 3 to 5 that circumstance should be noted that the means is not necessarily uniform over its entire length: its shape may vary, or be adjustable, at various points of the means independent of its other parts. One achieves in this way that the electron curtain can be made not only uniform but also variable of its intensity in any desired way, in the breadth direction of the curtain.

It is obvious to a person skilled in the art that different embodiments of the invention are not confined to the examples presented but may rather vary within the scope of the claims following below.

We claim:

1. A means for creating an electron curtain comprising an elongated, electron-emitting filament, a shell encircling the filament to that the filament is located in an elongated depression formed by the shell, members for accelerating the electrons, and a chamber in which the filament with its encircling shell has been placed and the wall of which contains a window transparent to electrons, through which the electron curtain can be directed, the shell encircling the filament being shaped on both margins of the depression into an accelerating electrode which can be brought to a negative potential with reference to the wall of the chamber, and the depression constituting a diffusion space for the electrons emitted from the filament, in the region of said space there being mouldable parts by the aid of which the admission of electrons into the accelerating electric field and thereby the intensity of the electron curtain that is produced are adjustable, the shell comprises movable parts by the aid of which it is possible to change at least one of the shape of the depression and the spacing of the electrodes and thereby to regulate the admission of electrons into the accelerating electric field, and that the shell has been connected to the outside of the chamber by means of a mechanism enabling the shell parts to be moved while the means is in operation.

2. Means according to claim 1, wherein the margins of the depression serving as accelerating electrodes consist of an elastic, mouldable material.

3. Means according to claim 1 wherein on the bottom of the depression have been provided two parallel projections between which the filament has been placed so that the projections serve as additional electrodes which regulate the admission, into the diffusion space formed by the depression, of the electrons emitted from the filament.

4. Means according to claim 3, wherein the projections serving as additional electrodes consist of an elastic, mouldable material.

* * * * *

UNITED STATES PATENT AND TRADEMARK OFFICE

CERTIFICATE OF CORRECTION

PATENT NO. : 4,572,957

DATED : February 25, 1986

INVENTOR(S) : Pertti Puumalainen; Pertti Sikanen

It is certified that error appears in the above-identified patent and that said Letters Patent is hereby corrected as shown below:

On the title page, Item [30] should read:

Foreign Application Priority Data

May 3, 1983 [FI] Finland .................. 831523

Signed and Sealed this

*Twenty-sixth* Day of *August 1986*

[SEAL]

*Attest:*

DONALD J. QUIGG

*Attesting Officer* *Commissioner of Patents and Trademarks*